(12) United States Patent
Toftloekke et al.

(10) Patent No.: US 8,358,505 B2
(45) Date of Patent: Jan. 22, 2013

(54) INTEGRATED LIQUID COOLING SYSTEM

(75) Inventors: Mikkel Block Toftloekke, Brønderslev (DK); Christopher Ratliff, Santa Cruz, CA (US); Peter Lykke, Aalborg (DK); Todd Berk, Burbank, WA (US); André Sloth Eriksen, Morgan Hill, CA (US)

(73) Assignee: Asetek A/S, Bronderslev (DK)

( * ) Notice: Subject to any disclaimer, the term of this patent is extended or adjusted under 35 U.S.C. 154(b) by 225 days.

(21) Appl. No.: 12/914,190

(22) Filed: Oct. 28, 2010

(65) Prior Publication Data

US 2012/0103576 A1 May 3, 2012

(51) Int. Cl.
*H05K 7/20* (2006.01)

(52) U.S. Cl. ........ 361/703; 361/688; 361/689; 361/690; 361/691; 361/692; 361/693; 361/694; 361/695; 361/696; 361/697; 361/698; 361/699; 361/700; 361/701; 361/702

(58) Field of Classification Search ........... 361/688–703
See application file for complete search history.

(56) References Cited

U.S. PATENT DOCUMENTS

| | | | | |
|---|---|---|---|---|
| 5,420,753 | A * | 5/1995 | Akamatsu et al. ............ | 361/719 |
| 2005/0230080 | A1 | 10/2005 | Paul et al. | |
| 2007/0002538 | A1* | 1/2007 | Tomioka ....................... | 361/695 |
| 2007/0039719 | A1 | 2/2007 | Eriksen | |
| 2008/0223552 | A1* | 9/2008 | Onishi et al. ................. | 165/80.4 |
| 2008/0230208 | A1 | 9/2008 | Rasmussen | |
| 2009/0009968 | A1 | 1/2009 | Hongo | |
| 2009/0218072 | A1 | 9/2009 | Eriksen | |

FOREIGN PATENT DOCUMENTS

| | | |
|---|---|---|
| JP | 2007-272294 | 10/2007 |
| WO | WO 2008/133101 | 11/2008 |

OTHER PUBLICATIONS

International Search Report and Written Opinion for related International application No. PCT/IB2010/002906, dated Aug. 19, 2011.
International Search Report and Written Opinion for corresponding International application No. PCT/US2010/054457, dated Aug. 8, 2011.
New Application entitled "Liquid Cooling System for an Electronic System", filed Oct. 28, 2010, (27 pages).

* cited by examiner

*Primary Examiner* — Hung S Bui
*Assistant Examiner* — James Wu
(74) *Attorney, Agent, or Firm* — Finnegan, Henderson, Farabow, Garrett & Dunner, LLP

(57) ABSTRACT

A liquid cooling system includes a monolith that is configured to be coupled to a motherboard of the computer. The monolith may be monolithic planar body having a first surface and an opposite second surface, and may include a heat absorption region and a heat dissipation region. The heat absorption region may be at least one location on the monolith that is configured to be in thermal contact with a heat generating component of the motherboard, and the heat dissipation region may be at least one location on the monolith where a liquid-to-air heat exchanger is attached to the monolith. The liquid cooling system may also include a channel extending on the second surface of the monolith and a pump that is configured to circulate the liquid coolant through the channel. The channel may be a trench on the second surface of the monolith that is configured to circulate a liquid coolant between the heat absorption region and the heat dissipation region.

26 Claims, 10 Drawing Sheets

INTEGRATED LIQUID COOLING SYSTEM

TECHNICAL FIELD

The present invention is related generally to a liquid cooling system for cooling electronic components within a console.

BACKGROUND

Computers include IC (integrated circuit) devices or IC chips that generate heat during operation. With the advent of VLSI (very large scale integration) technology, the heat generation of IC devices has increased significantly with every new generation. As a result, the semiconductor industry is facing the problem of fast removal of heat from IC devices and from electronic systems that use these devices. While the problem of heat removal from IC devices is an old one, it has gained prominence in recent years due to increasing numbers of transistors that are packed into a single IC device while reducing the physical size of the device. Increasing number of transistors compacted into a smaller area results in a greater amount of heat that must be removed from that smaller area. Heat must be removed from these IC devices in order to keep the devices within their safe operating temperatures. Historically, heat sinks with associated fans have been used to remove heat from the IC devices of computers. However, as heat generation of IC devices and cooling requirements of computers increase, liquid cooling solutions are being adopted to keep device temperatures and fan noise within acceptable levels.

Liquid cooling systems circulate a liquid coolant in a closed loop to transfer heat from heat generating electronic devices to the ambient air. The liquid cooling system circulates a liquid through a heat sink or a heat transfer module attached to one or more electronic devices of the computer. As the liquid passes through the heat sink, heat is transferred from a hot IC device to the cooler liquid. The hot liquid then moves out to a radiator at the back of the computer case or console and transfers the heat to ambient air. The cooled liquid then travels back through the system to the IC device to continue the process. A liquid cooling system, typically includes components, such as, one or more heat sinks (or heat transfer modules) to transfer heat from the IC devices to the coolant, one or more radiators or heat exchangers to dissipate heat from the coolant, a pump to circulate the coolant within the system, a reservoir to hold a sufficient quantity of the coolant, and tubing to fluidly couple the different components. To accommodate these components, liquid cooling systems typically require a relatively large amount of space within the console. Therefore, liquid cooling systems have more commonly been used in servers and relatively large desktop computer systems where space is not a constraint. Applying a liquid cooling system to space-constrained computer systems (such as, smaller desktops and notebook computers), is however, challenging.

Furthermore, liquid cooling systems require a significant level of technical knowledge to install. Since computer consoles and the layout of IC devices within the console vary widely, a liquid cooling system typically has to be custom-fitted within a console. That is, tubes must be cut and routed to direct the coolant to different IC devices while making use of the available space within the console. This need for custom routing increases the likelihood of improper installation of the cooling system that could result in leakage of the coolant within the console. Coolant leaks may cause catastrophic damage to IC devices.

The disclosed liquid cooling systems are directed at overcoming these and/or other shortcomings in existing technology.

SUMMARY OF THE DISCLOSURE

In one aspect, a liquid cooling system for a computer is disclosed. The liquid cooling system includes a monolith that is configured to be coupled to a motherboard of the computer. The monolith may be monolithic planar body having a first surface and an opposite second surface, and may include a heat absorption region and a heat dissipation region. The heat absorption region may be at least one location on the monolith that is configured to be in thermal contact with a heat generating component of the motherboard, and the heat dissipation region may be at least one location on the monolith where a liquid-to-air heat exchanger is attached to the monolith. The liquid cooling system may also include a channel extending on the second surface of the monolith and a pump that is configured to circulate the liquid coolant through the channel. The channel may be a trench on the second surface of the monolith that is configured to circulate a liquid coolant between the heat absorption region and the heat dissipation region.

In another aspect, a liquid cooling system for a notebook computer is disclosed. The cooling system includes a monolith that is configured to be coupled to a motherboard of the notebook computer. The monolith may be an aluminum monolithic planar body having a first surface and a second surface that is opposite the first surface. The cooling system may include a channel containing a liquid coolant. The channel may be a machined trench extending along a predefined path on the monolith, and may be configured to enclose the coolant therein, and direct the coolant along the predefined path. The cooling system may also include at least two cutouts extending from a base of the channel to the first surface of the monolith, and a cold plate attached at a first cutout and a liquid-to-air heat exchanger attached at a second cutout. A first surface of the cold plate may be configured to be in thermal contact with a heat generating component on the motherboard and an opposite second surface may be in contact with the coolant in the channel.

In yet another aspect, an integrated liquid cooling system for a notebook computer is disclosed. The cooling system may be configured to be coupled to a motherboard of the notebook computer as one single part. The cooling system includes a monolith that is configured to be coupled to the motherboard of the notebook computer. The monolith may be a monolithic planar body that extends over a plurality of heat generating electronic components on the motherboard, and may include a first surface having regions that are configured to be in thermal contact with the plurality of heat generating electronic components and an opposite second surface. The cooling system may also include a channel with a liquid coolant therein. The channel may be a machined trench extending along a predefined path on the second surface of the monolith. The predefined path may extend between at least the regions of the monolith in thermal contact with the plurality of heat generating electronic components and at least one heat dissipation location of the monolith. The cooling system may also include a cap which is attached to the second surface of the monolith to enclose the coolant in the channel. The cooling system may further include a liquid-to-air heat exchanger coupled to the at least one heat dissipation location of the monolith.

DETAILED DESCRIPTION

The following detailed description illustrates the integrated liquid cooling system by way of example and not by way of limitation. Although the description below describes an application of the liquid cooling system to a notebook computer, embodiments of the disclosed cooling systems may be applied to cool a heat generating component in any application. The description enables one skilled in the art to make and use the present disclosure for cooling any electronic component.

Figure 1:
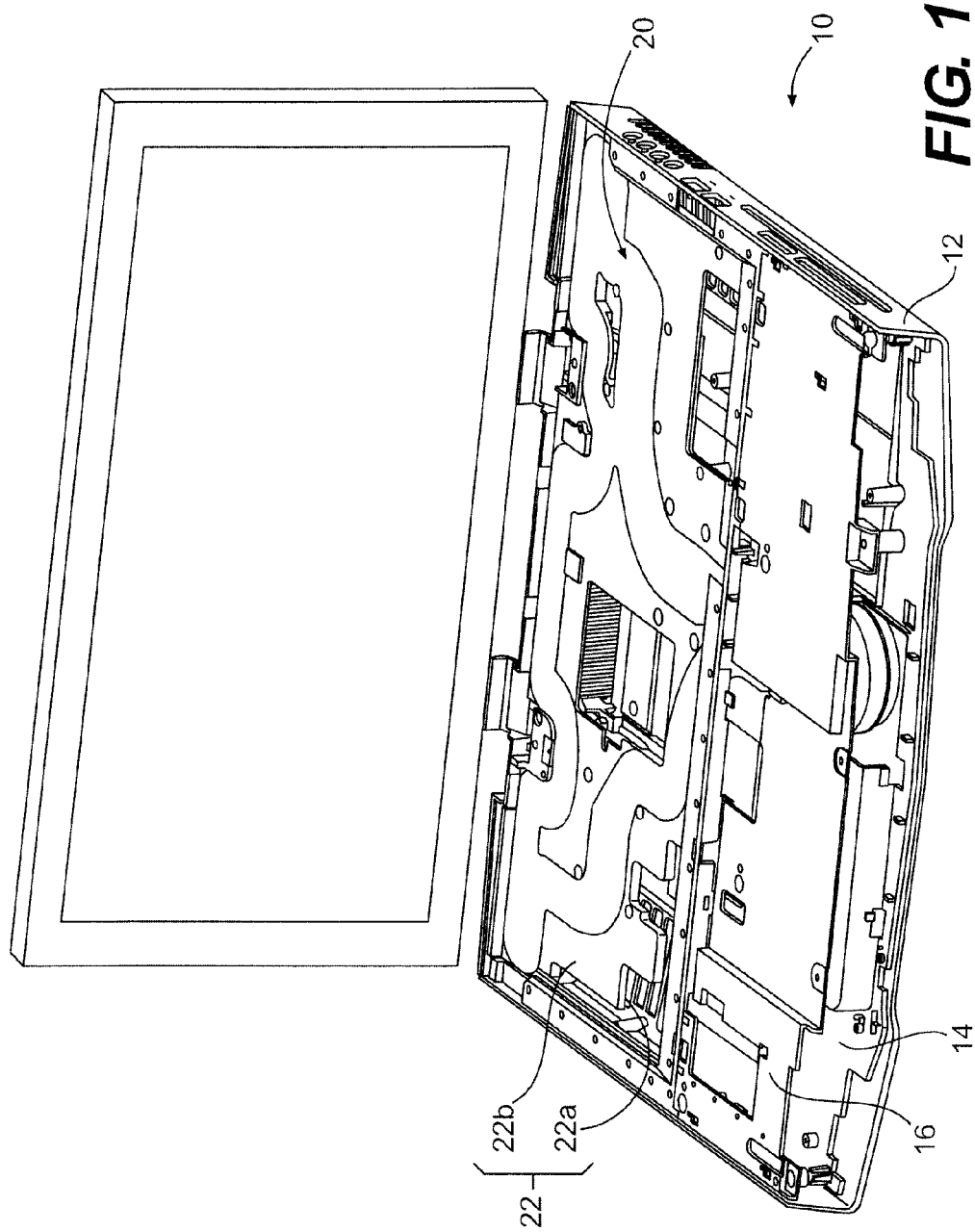
FIG. 1 is an illustration of an embodiment of the disclosed integrated liquid cooling system applied to a notebook computer.

FIG. 1 illustrates an embodiment of an integrated liquid cooling system 20 used to cool IC devices of a notebook computer 10. Computer 10 may, without limitation, include any type of notebook computer or another mobile electronic device (such as, for example, an ebook reader, a portable gaming device, etc.). In FIG. 1, the keyboard face of computer 10 has been removed to show cooling system 20 positioned within console 12 of computer 10. Computer 10 may include several IC devices and other electronic components, such as CPUs (central processing units), GPU (graphics processing units), memory devices, memory controllers, power supplies, etc. that generate heat during operation. Several of these heat generating IC devices (not visible in FIG. 1) may be coupled to a motherboard 14 of computer 10. As is known in the art, motherboard 14 may include a printed circuit board (PCB) that electrically couples the IC devices together and provide connections for other peripherals, such as adapter cards, daughter cards, etc. Liquid cooling system 20 may include a first side 22a and an opposite second side 22b, and may be positioned such that first side 22a faces motherboard 14. The liquid cooling system 20 may be positioned above motherboard 14 such that regions of the cooling system 20 are in thermal contact with one or more heat generating IC devices on motherboard 14. Cooling system 20 may be dimensioned to fit within the available space of computer 10, and may be contoured to accommodate the components of computer 10 positioned around it, without hindrance. For instance, a stiffness plate 16 that serves as a backing for the key board (removed in FIG. 1) of computer 10 may be positioned on the cooling system 20. It should be noted, that although the cooled IC devices are described as being positioned on motherboard 14, this is not a requirement. For instance, the cooled IC devices may be positioned anywhere within computer 10, such as on a daughter card that is electrically coupled to motherboard, etc. Also, although the cooled devices are described as being IC devices, any type of device of computer 10 may be cooled with cooling system 20.

Figure 2:
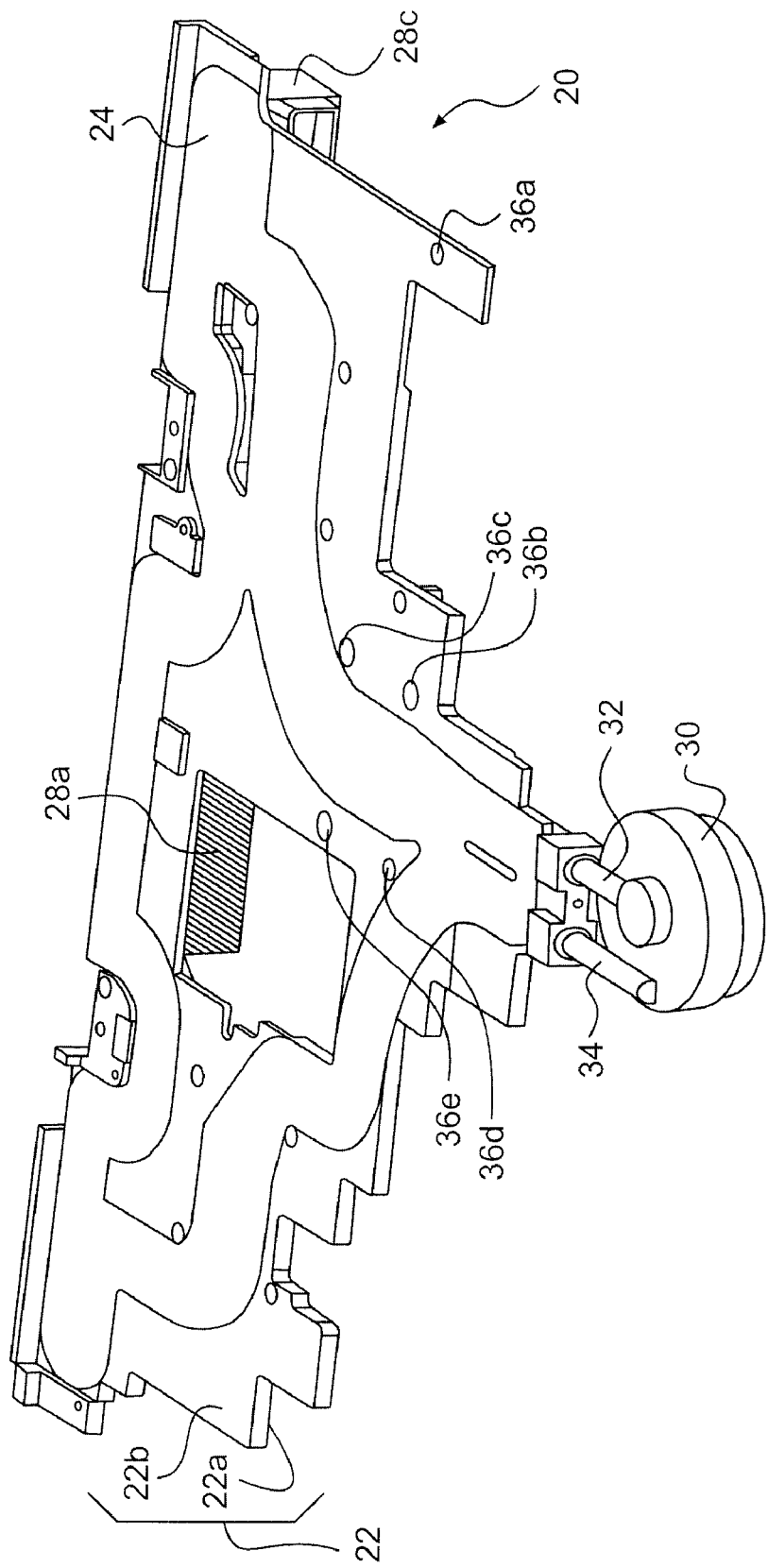
FIG. 2 is an illustration of an embodiment of the disclosed integrated liquid cooling system.

FIG. 2 is an illustration of the cooling system 20 of FIG. 1 removed from computer 10. Cooling system 20 may be comprised of several components that are joined together to form an integrated system. This integrated cooling system 20 may be installed and removed from computer 10 as one single part. For instance, the cooling system 20 may include mounting features (such as, for example, holes 36a, 36b, 36c, 36d, 36e, etc.) that align with attachment features of the motherboard 14 and/or console 12 of computer 10. These mounting features may be used to attach the cooling system 20 as one single part to the motherboard 14 and console 12. For instance, in one embodiment, threaded screws (not shown) may pass through one or more of holes (36a, 36b, etc.) on cooling system 20, and through mating holes on motherboard 14, to attach to console 12. In another embodiment, some of the holes (36b, 36c, 36d, 36e, etc.) may be used to attach cooling system 20 to motherboard 14 while other holes (such as, for example 36a) may be used to attach cooling system 20 along with motherboard 14 to console 12. To remove the cooling system 20 from computer 10, these threaded screws may be removed, and the cooling system 20 lifted off the motherboard 14 as one single part. Although an attachment mechanism using threaded screws is described herein, any attachment mechanism may be used to attach the cooling system 20 as one single part to computer 10.

Figure 3:
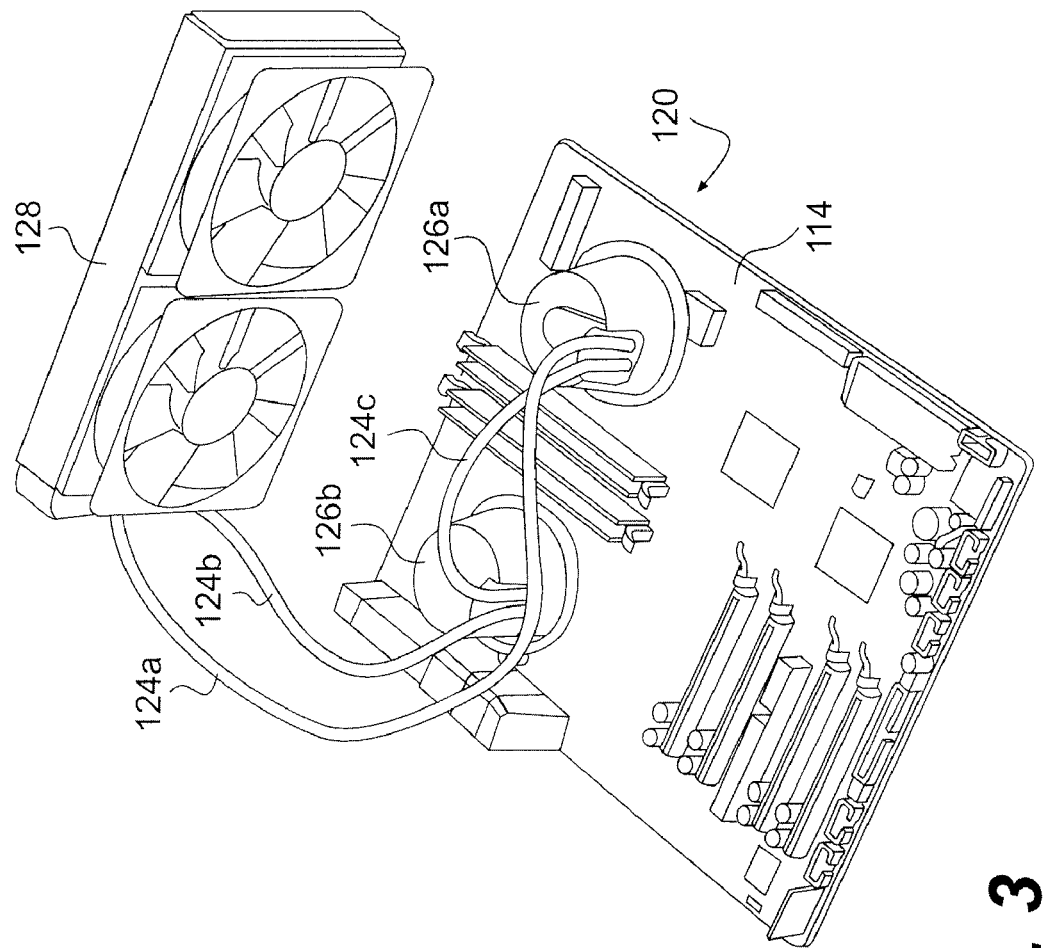
FIG. 3 is an illustration of a prior art liquid cooling system.

FIG. 3 illustrates a prior art liquid cooling system 120 used to cool IC devices coupled to a motherboard 114 of a computer. To install cooling system 120 to mother board 114, the first and second heat sinks (126a and 126b) are each positioned over their respective IC device and each are individually attached to the motherboard 114. The heat sinks are then fluidly coupled to a heat exchanger 128, which is individually attached to the motherboard 114 or the computer, using tubes 124a, 124b, 124c, etc. To remove cooling system 120, the individual components are separately decoupled from, and removed from, motherboard 114. FIG. 3 and its related description is only provided herein to illustrate and contrast the differences between the prior art liquid cooling system 120, in which the components of the liquid cooling system are installed and removed individually, and the disclosed integrated liquid cooling system 20 in which the cooling system, along with its constituent components, are attached to, and removed from, computer 10 as one part. Attaching and removing the cooling system 20 from computer 10 as one part simplifies the installation of the cooling system 20, and decreases the possibility of leaks that can lead to catastrophic failure of a computer. To enable integrated cooling system 20 to be applied to different configurations of computers (different form factors of console 12, different motherboard 14 layout, different number of IC devices that require cooling, differences in locations and sizes of interfering components within console 12, etc.) the sizes and/or configurations of one or more constituent components of integrated cooling system 20 may be modified.

Referring to FIG. 2, the constituent components of cooling system 20 may include a monolith 22, one or more pumps 30, one or more cold plates (not shown in FIG. 2), and one or more heat exchangers 28a, 28b, 28c (28b not shown in FIG. 2). These components may be coupled together so that cooling system 20 forms an integrated system. Although not a requirement, in preferred embodiments, the constituent components of the system may be coupled together such that cooling system 20 may form a single substantially rigid part. In these embodiments, monolith 22 may be fabricated from a relatively stiff material (such as, for example, a metal such as aluminum, copper, or another suitable material such as plastic), and the pump 30, cold plates, and heat exchangers may be coupled to the monolith 22 such that relative motion between the components of the system may be minimized. In these embodiments, the monolith 22 may provide structural stiffness to the cooling system 20 that enables the cooling system 20 to be removed and attached to computer 10 as one single part. It should be noted that although this embodiment of cooling system 20 is described as a single substantially rigid part with minimal relative motion between the components, cooling system 20 may exhibit some flexural compliance. As a person of ordinary skill in the art knows, for an elastic plate in bending, flexural compliance (or flexural rigidity, or flexural stiffness) is a measure of the out of plane displacement of the system due to a unit bending force. This flexural compliance may be a function of, among others, the thickness and material properties of monolith 22. In general, as the thickness and the modulus of elasticity of the monolith material increases, the flexural compliance of cooling system 20 decreases. Therefore, even in embodiments where cooling system 20 is a single substantially rigid part, the cooling system 20 may exhibit some amount of flexure (and relative motion between the components), due to its flexural compliance.

Figure 4:
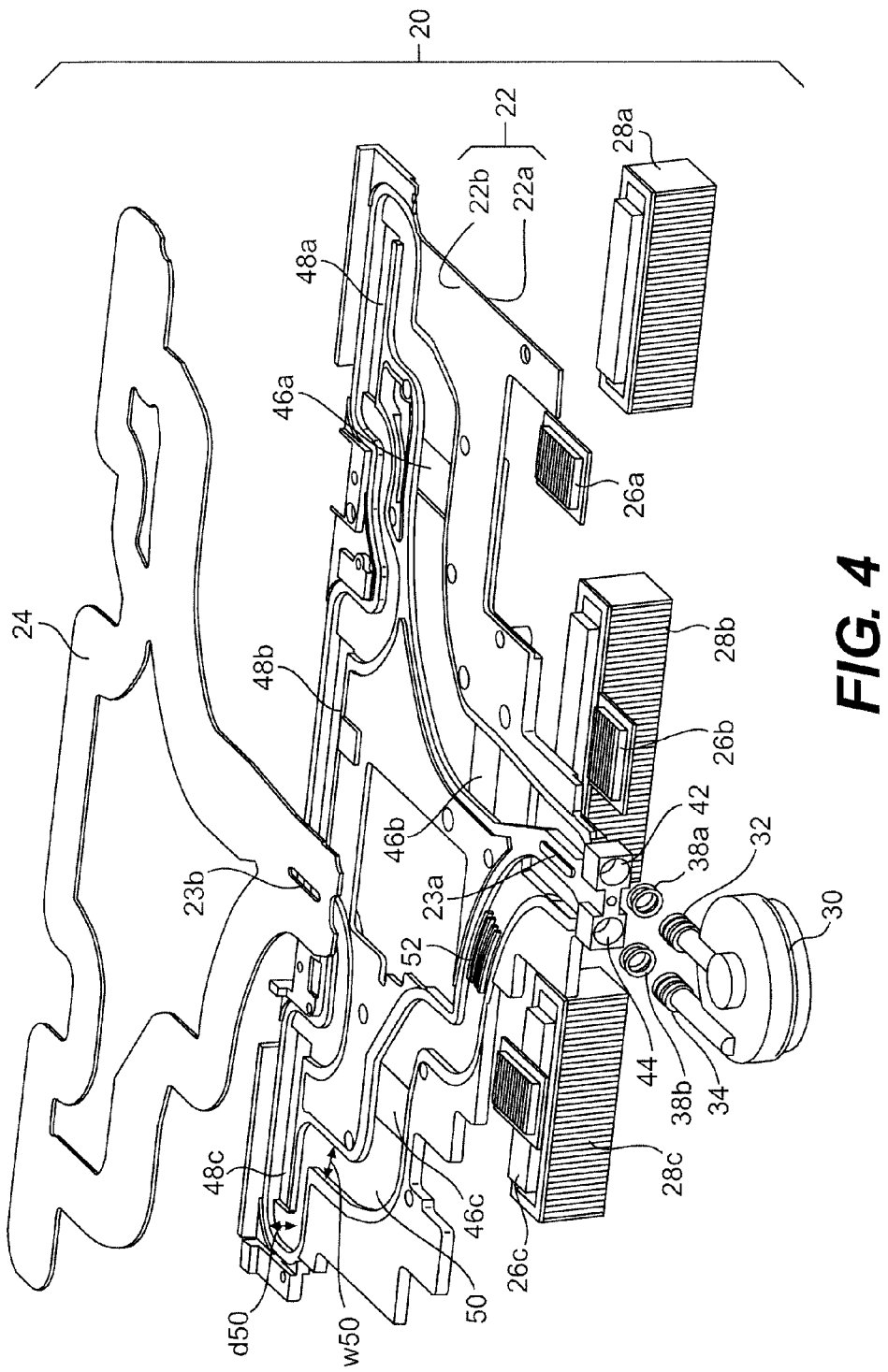
FIG. 4 is an illustration of an exploded view of the cooling system of FIG. 2.

FIG. 4 shows an exploded view of integrated cooling system 20 showing its constituent components. Monolith 22 may have the form of a plate with first surface 22a and an opposite second surface 22b. The size and thickness $t_{22}$ of monolith 22 may depend upon the application. For instance, the available size within computer 10, the number and location of the heat generating components within computer 10, and the desired cooling capacity of cooling system 20, may be some of the factors that drive the size and thickness $t_{22}$ of monolith 22. In some embodiments, the thickness $t_{22}$ of monolith may vary between about 2.5 mm and about 6 mm. In preferred embodiments, thickness $t_{22}$ may vary between 3 mm and about 5 mm, and in more preferred embodiments, thickness $t_{22}$ may vary between about 3.5 mm and about 4.5 mm. As described previously, when attached to motherboard 14, first surface 22a of the monolith is positioned to face the IC devices on the motherboard 14 (see FIG. 1).

Monolith 22 may also include a coolant channel 50 to circulate a coolant through a path defined by the channel 50. Any liquid coolant known in the art (such as, for example, water, alcohol, etc.) may be circulated through channel 50. Coolant channel 50 may be a path that is machined on the second surface 22b of monolith 22. The channel 50 may start from an outlet 34 of pump 30, extend along a path in the monolith 22, and terminate at the inlet 32 of pump 30. The path that the coolant channel 50 traces through monolith 22 may be selected so that channel 50 passes over the locations of selected IC devices on motherboard 14 (see FIG. 1). These selected IC devices may be the heat generating IC devices (such as, CPUs, GPUs, etc.) that are desired to be cooled. The size (such as width $w_{50}$ and depth $d_{50}$) of channel 50 may, without limitation, depend upon the application. Typically, width $w_{50}$ and depth $d_{50}$ may be a function of the desired cooling capacity and the number/location of the IC devices on computer 10. In all cases, the depth $d_{50}$ will be less than the thickness $t_{22}$ of monolith 22. The depth $d_{50}$ and width $w_{50}$ may vary along the length of channel 50 or may substantially be a constant. In some embodiments, an average width $w_{50}$ of channel 50 may vary from about 10 mm to about 20 mm, and an average depth $d_{50}$ may vary from about 1 to about 4 mm. In preferred embodiments, width $w_{50}$ may vary between about 13 mm and about 17 mm, and depth $d_{50}$ may vary between about 1.5 and 3 mm. In a more preferred embodiment, the average values of width $w_{50}$ and depth $d_{50}$ may be about 15 mm and about 2.2 mm respectively.

Figure 8A:
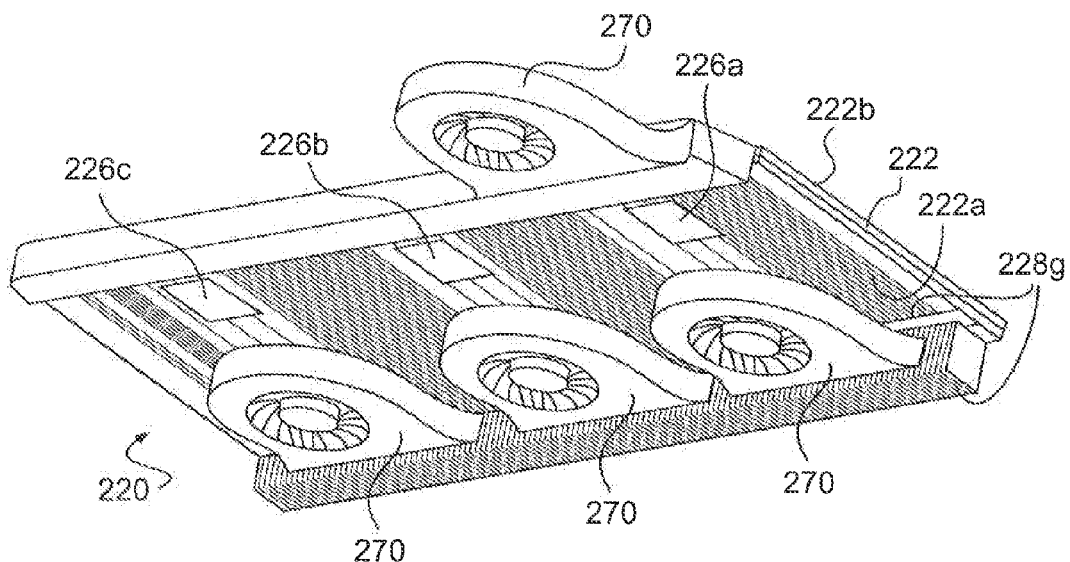
FIGS. 8A-8C are illustrations of another exemplary embodiment of the disclosed integrated liquid cooling system.
Figure 8B:
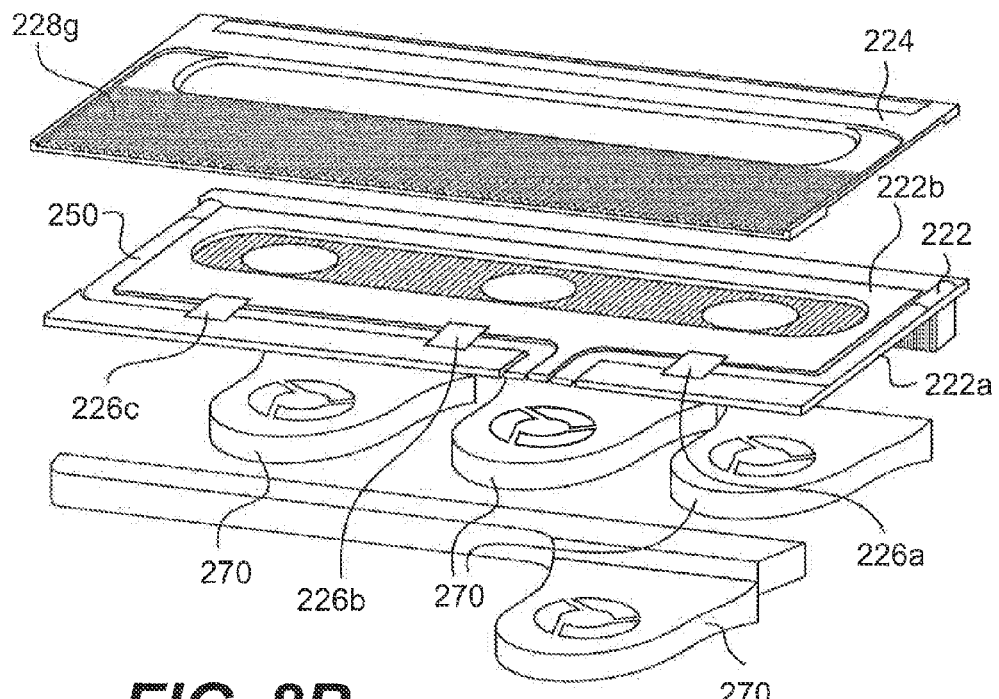

In some embodiments, a coolant channel cap 24 may attached to monolith 22 over the coolant channel 50 to enclose the coolant in the coolant channel 50. The cap 24 may be attached to monolith 22 by any means (such as, for example, using an adhesive, soldering, brazing, welding, etc.). Cap 24 may be made of the same material as monolith 22 or may be made of a different material. In a preferred embodiment, both cap 24 and monolith 22 may be made of aluminum. In some embodiments, as illustrated in FIG. 4, cap 24 may have a shape similar to that of channel 50, and may be configured such that, after assembly, a top surface of cap 24 is at substantially the same level as the second surface 22b of monolith 22. In such an embodiment, channel 50 may include a section that is configured to receive cap 24 therein. For instance, channel 50 may include a section having a depth and width similar to that of cap 24, so that cap 24 would fit within that section of channel 50 after assembly. In other embodiments, cap 24 may have another shape (such as, for example, that of monolith 22 as illustrated in the embodiment of FIG. 8B). Cap 24 may have one or more alignment features 23b that align with corresponding alignment features 23a on monolith 22. These alignment features 23a, 23b may help to align cap 24 with coolant channel 50.

The coolant channels 50 may include slots or cutouts 46a, 46b, 46c at selected regions of the channel 50. These cutouts may extend from the base of channel 50 to first surface 22a of monolith 22. These selected regions may correspond with locations of the IC devices that are desired to be cooled. Cold plates 26a, 26b, 26c may be coupled to monolith 22 at these regions. Although the embodiment of FIG. 4 shows three cold plates (a first cold plate 26a, a second cold plate 26b, and a third cold plate 26c) attached to monolith 22, this is exemplary only, and any number of cold plates may be attached to monolith 22. For instance, in an embodiment where only two IC devices (one CPU one GPU) are desired to be cooled, only two cold plates may be used. In some embodiments, the coolant channel 50 and the cold plates may be arranged so that the coolant first passes over the hottest component before passing over the other components. For example, in the embodiment illustrated in FIG. 4, the coolant passes over third cold plate 26c to remove heat from the IC device in thermal contact with the third cold plate before passing over the second and first cold plates 26b, 26a. The cold plates (26a, 26b, 26c) may be attached to the monolith in any manner (such as, for example, using an adhesive, soldering, brazing, welding, etc.).

Figure 5A:
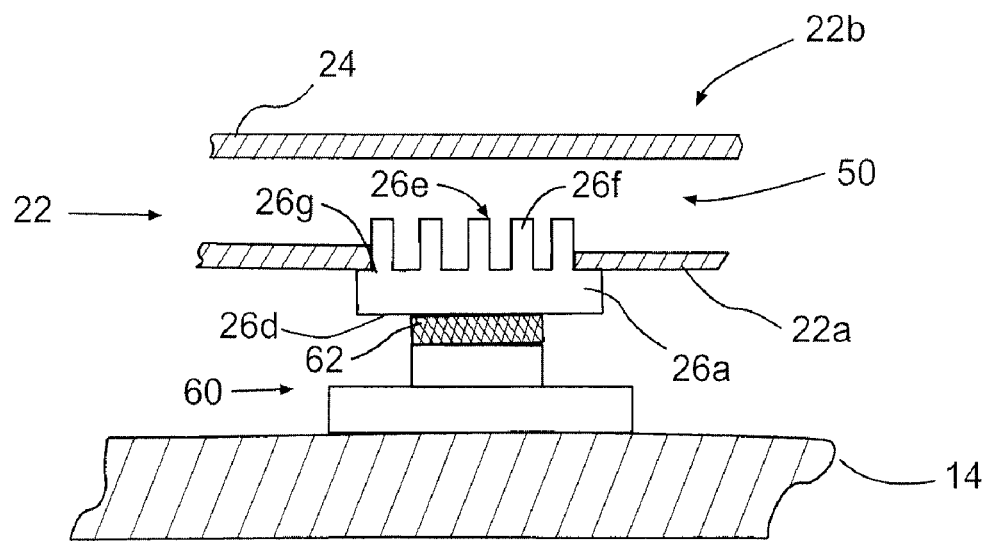
FIGS. 5A-5D are schematic illustrations showing a region of an exemplary liquid cooling system in thermal contact with an IC device of the computer of FIG. 1.

FIG. 5A shows an exemplary embodiment of first cold plate 26a attached to monolith 22. First cold plate 26a may be made of any heat conducting material. In some embodiments, first cold plate 26a may be made of the same material as monolith 22, and in other embodiments, a different material may be used. In a preferred embodiment, copper may be used as the material of first cold plate 26a. First cold plate 26a may include a first surface 26d that is configured to be in thermal contact with an IC device 60 coupled to motherboard 14, and an opposite second surface 26e. Second surface 26e may include fins 26f that protrude into channel 50 of monolith 22 to contact with the coolant in channel 50. In place of, or in addition to, fins 26f, second surface 26e may include other features (such as, micropins, etc.) that are configured to create turbulence in the coolant flow in the vicinity of first cold plate 26a. Turbulence in the coolant flow disrupts the boundary layer at the interface between the coolant and the second surface 26e and increases the heat exchange between the first cold plate 26a and the coolant. Second surface 26e may also include a flat region 26g around the fins 26f, that mate and attach with, a mating region on the first surface 22a of monolith 22. To attach first cold plate 26a to monolith 22, fins 26f of the second surface 26e may be positioned to protrude into channel 50 through cutout 46a (see FIG. 4), and the flat surface 26g of the first cold plate 26a attached with the first surface 22a of monolith 22. These surfaces may be attached together in any manner, such as, for example, using an adhesive, solder, braze, or by another known mechanism.

Although first surface 26d of first cold plate 26a is shown to project from the first surface 22a of monolith 22, this is only exemplary. In some embodiments, the first surface 26d may be level with first surface 22a of monolith 22. In these embodiments, the first surface 22a of monolith 22 may include a recess to accommodate the thickness of flat surface 26g of first cold plate 26a. In some embodiments, the first surface 26d may directly contact a surface of IC device 60 and in other embodiments (as shown in FIG. 5A), a thermal interface material 62 (such as, thermal grease, etc.) may be placed in between the first surface 26d and the IC device 60.

Figure 5B:
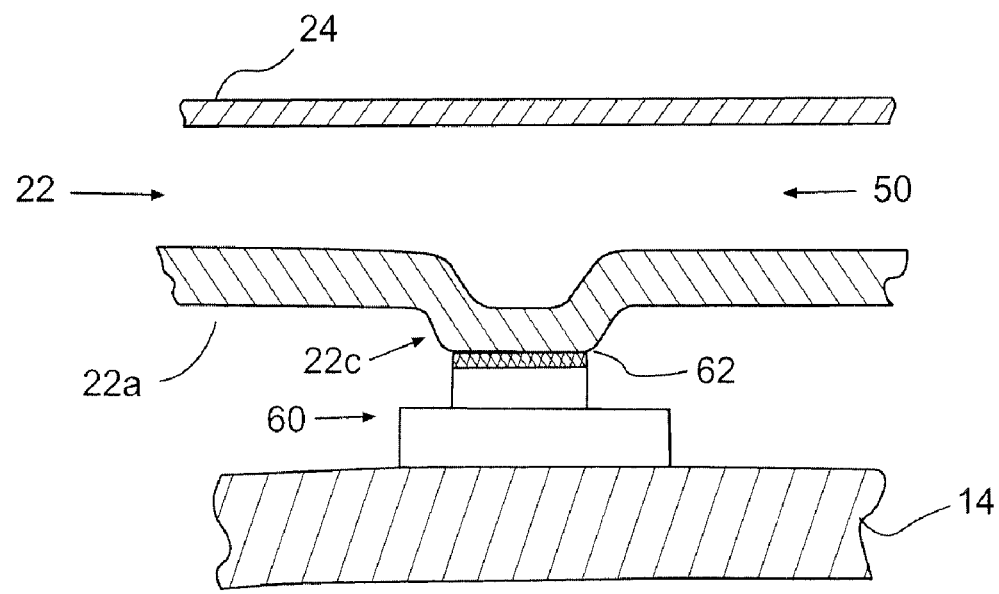
Figure 5C:
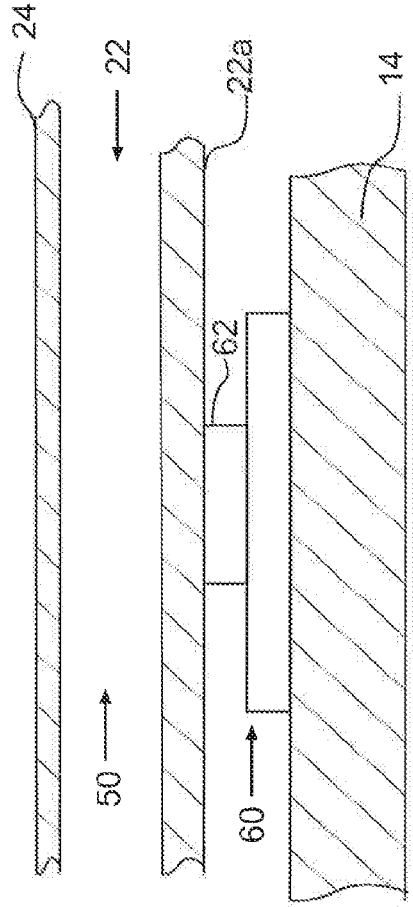

It is also contemplated that, in some embodiments, a separate cold plate may be eliminated and a region of first surface 22a of monolith 22 may be in thermal contact with the IC device directly. Such an embodiment is illustrated in FIG. 5B. In the embodiment of FIG. 5B, a region in channel 50 of monolith 22 may be modified to include a projection 22c that protrudes from first surface 22a of monolith 22. This projection 22c may be in thermal contact with IC device 60. It is also contemplated that, as illustrated in FIG. 5C, the projection 22c may also be eliminated. In these embodiments, the first surface 22a of monolith 22 may be in thermal contact with IC device 60 directly. In some such embodiments, the region of channel 50 opposite the region that interfaces with an IC device 60 may include fins (similar to the features 52 illustrated in FIG. 4 and described below). Although FIG. 5C illustrates a region of first surface 22a within channel 50 to be in thermal contact with IC device 60, it is contemplated that any region of first surface 22a or second surface 22b may be in thermal contact with IC device 60. In an application, the type of thermal contact provided may depend on the cooling requirement and the heat dissipation of IC device 60. For example, a cold plate (as described with reference to FIG. 5A) may be used to cool a device with a large heat dissipation or a heat sensitive IC device, while any region of monolith 22 may contact and cool an IC device (as described with reference to FIGS. 5B and 5C) with a relatively low heat dissipation.

Figure 5D:
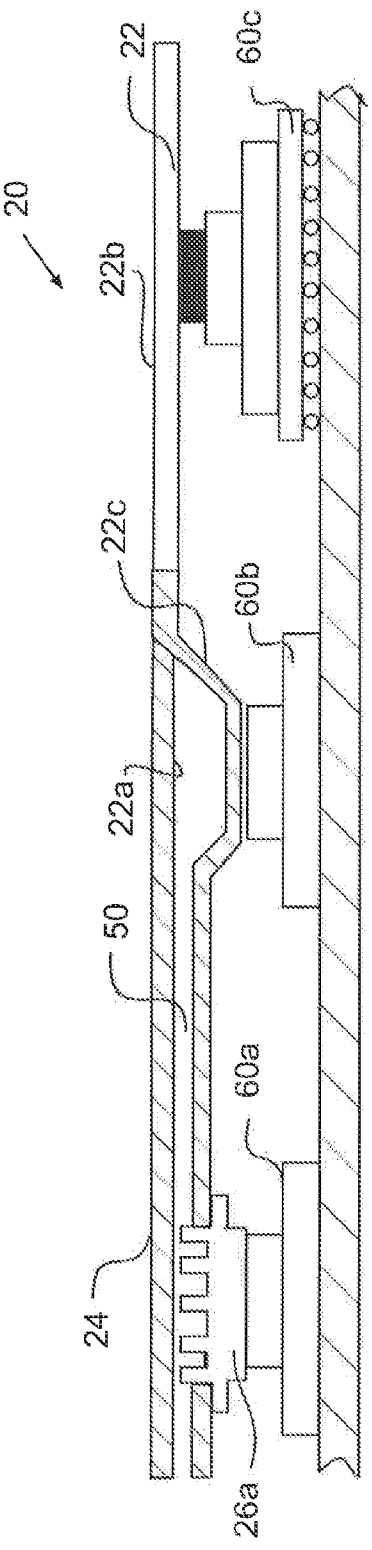

In a cooling application where a motherboard 14 includes IC devices that have different heat dissipation or cooling requirements, an embodiment of cooling system 20 may thermally contact and remove heat from the different IC devices differently. For example, as illustrated in FIG. 5D, IC device 60a, that has a high cooling requirement, may be thermally contacted using a cold plate 26a (as described with reference to FIG. 5A), IC device 60b, that has lower cooling requirement than device 60a, may be thermally contacted using a projection 22c of monolith 22 (as described with reference to FIG. 5B), and IC device 60c, which has a lower cooling requirement than device 60b, may be thermally contacted by the first surface 22a of monolith 22 (as described with reference to FIG. 5C). Although not illustrated herein, in some embodiments, devices may be thermally contacted and cooled using the second surface 22b.

With reference to FIG. 4, in addition to, or in place of fins 26f of second surface 26e (see FIG. 5A), cooling channel 50 may include features 52 that are configured to disrupt the coolant flow and create turbulence in the coolant at selected regions of the channel 50. These selected regions may correspond to locations proximate a cold plate, or regions of monolith 22 in thermal contact with an IC device.

With reference to FIG. 4, in addition to cutouts 46a, 46b, and 46c for the cold plates, coolant channel 50 may also include slots 48a, 48b, and 48c for heat exchangers. The number of heat exchangers used in a cooling system 20 may depend upon the application. The embodiment of cooling system 20 illustrated in FIG. 4 includes three liquid to air heat exchangers (first heat exchanger 28a, second heat exchanger 28b, and third heat exchanger 28c). In general, these slots (48a, 48b, and 48c) may be provided at any location of channel 50. Practically, these slots (48a, 48b, and 48c) may be positioned based on the cooling requirement and based on the available space of within computer 10. In the embodiment illustrated in FIG. 4, the slots are positioned such that the coolant exiting third cold plate 26c is cooled by the three heat exchangers before proceeding to second cold plate 26b. In some embodiments, the location of slots and cold plates may be alternated such that the hot coolant that exits a cold plate may be cooled by a heat exchanger before proceeding to the next cold plate. Similar to the cutouts (46a, 46b, and 46c), slots 48a, 48b, and 48c may also extend from the base of channel 50 to first surface 22a of monolith 22. First, second, and third heat exchangers 28a, 28b, and 28c may be positioned at these slots 48a, 48b, and 48c, respectively. These heat exchangers may absorb heat from the passing coolant in channel 50 and transfer the heat to ambient air. Although any type of liquid to air heat exchanger known in the art may be used as the heat exchangers for cooling system 20, in preferred embodiments, an internally finned liquid to air heat exchanger may be used.

Figure 6A:
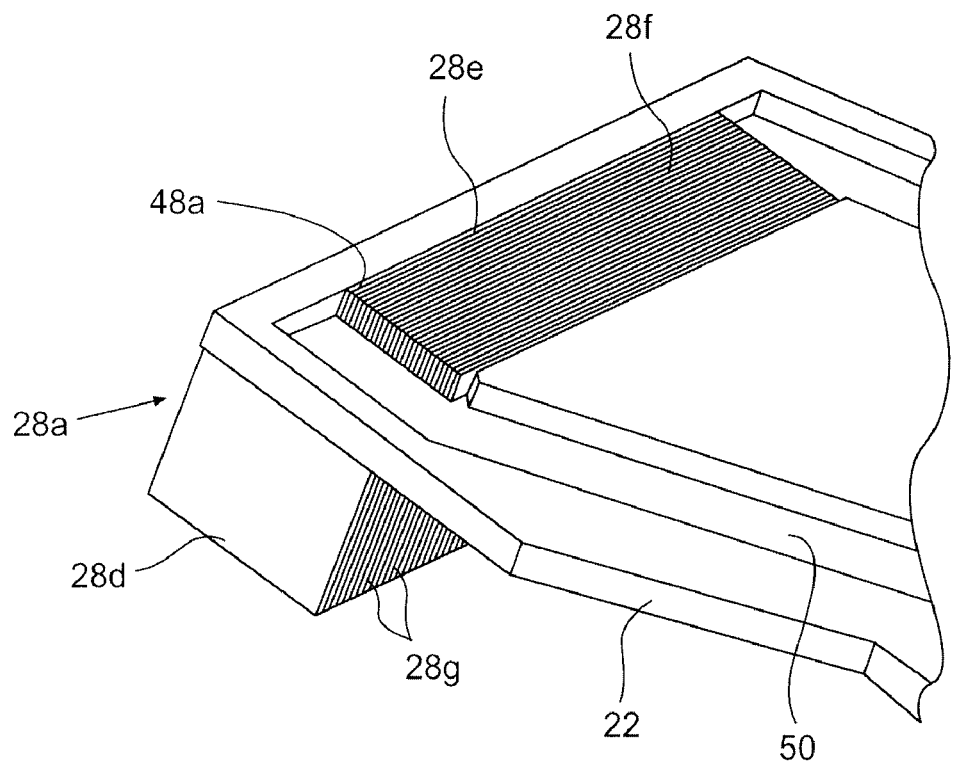
FIGS. 6A-6B are illustrations of an exemplary liquid-to-air heat exchanger of the cooling system of FIG. 2.
Figure 6B:
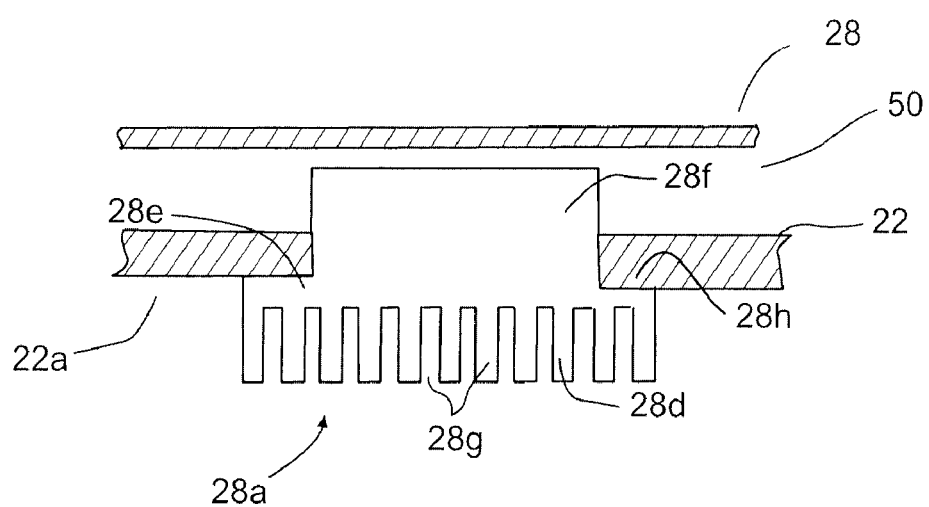

FIGS. 6A and 6B illustrate an embodiment of an internally finned first heat exchanger 28a positioned in slot 48a of monolith 22. The heat exchanger may be made of any material used for such purposes in the art, such as, for example, copper, aluminum, etc. The size of the heat exchanger may be selected so that the cooling system 20 can fit within the available space within computer 10 while providing the necessary surface area for cooling. First heat exchanger 28a may include a first surface 28d and an opposing second surface 28e. First surface 28d may include fins 28g that include multiple plates oriented parallel to each other. Second surface 28e may also include fins 28f that have multiple plates aligned parallel to each other. In some embodiments, as illustrated in FIG. 6A, the fins 28g on the first surface 28d and the fins 28f on the second surface 28e may be aligned in different directions, such as, for example, perpendicular to each other. However, in other embodiments, fins 28g and fins 28f may be aligned substantially parallel to each other. Second surface 28e may also include a flat region 28h that is adapted to mate with first surface 22a of monolith 22. Although FIGS. 6A and 6B depict flat region 28h to be positioned on either side of fins 28f, this is not a requirement. In general, flat region 28h and fins 28f may be oriented in any manner on second surface 28e. For example, in some embodiments, flat region 28h may be positioned on all sides of fins 28f (for example, along the perimeter on the second surface 28e of first heat exchanger 28a). To couple first heat exchanger 28a to monolith 22, the first heat exchanger 28a may be positioned on first surface 22a of monolith 22 such that fins 28f on second surface 28e protrude into channel 50 through slot 48a. The flat region 28h of the second surface 28e may then be attached to a mating region on first surface 22a of monolith 22. These surfaces may be attached together in any manner, such as, for example, using an adhesive, solder, braze, or by another known mechanism. In some embodiments, the cold plates (26a, 26b, and 26c) and the heat exchangers (28a, 28b, and 28c) may be attached to monolith 22 in one step.

When first heat exchanger 28a is attached to monolith 22, the coolant in channel 50 may flow in between the multiple plates of fins 28f on second surface 28e of the heat exchanger. As the hot coolants interacts with fins 28f, heat from the coolant may get transferred to fins 28f, thereby transferring heat from the hotter coolant to the colder first heat exchanger 28a. Meanwhile, on the opposite surface of first heat exchanger 28a, ambient air may flow past the multiple plates of fins 28g. As the air flows across fins 28g, heat transfer between fins 28g and the air can occur, thereby cooling the first heat exchanger 28a. In some embodiments, a fan coupled to computer 10 may blow air past fins 28g to cool first heat exchanger 28a.

Although fins 28g on first surface 28d, and fins 28f on the second surface 28e, are described to include parallel plates, this is not a requirement. In general, one or both of fins 28g and 28f may include plates oriented in any direction that allow air or water to flow between them. In place of, or in addition to plates, first surface 28d and the second surface 28e may include any type of features that are adapted to transfer heat from one medium to another. For example, in some embodiments, the fins on one or both of first surface 28d and second surface 28e may be replaced with, or additionally include other protruding features such as pins. These pins may assist in transfer of heat from the coolant to the first heat exchanger 28a, and from the first heat exchanger 28a to ambient air. In some embodiments, the pattern of fins 28g on first surface 28d and/or fins 28f on the second surface 28e may be configured to tailor the fluid flow proximate the fins to achieve a desired level of heat transfer. Although the plates of fins 28g and 28f are illustrated to be continuous in FIG. 6A, this is not a requirement. In some embodiments, some or all of plates of fins 28g and 28f may be made up of multiple segments with gaps between them. In some embodiments, all the heat exchangers of liquid cooling system 20 may be identical, while in other embodiments, they may be different. In general, in embodiments of cooling system 20 that include multiple heat exchangers, each heat exchanger may be adapted to fit in the available space and configured to provide the desired cooling capability.

Referring again to FIG. 4, liquid cooling system 20 may include a pump 30 to circulate the coolant through monolith 22. Pump 30 may be any pump that can be used to circulate a coolant through cooling system 20. Since pumps capable of this function are known in the art, extensive discussion of pump 30 is not provided herein. Pump 30 may be adapted to discharge the coolant into channel 50 through outlet 34 and receive the coolant from channel 50 through inlet 32. To integrate the pump 30 with monolith 22, inlet 32 and outlet 34 of pump 30 may be coupled with a mating inlet 42 and outlet 44, respectively, of monolith 22. Any known method of coupling (such as, for example, using couplings, interference fitting, attachment using an adhesive or another medium, etc.) may be used to couple pump 30 with monolith 22. To minimize coolant leaks from cooling system 20, a seal 38a may be positioned between inlets 32 and 42, and a seal 38b may be positioned between outlets 34 and 44. The size of the pump may be adapted to fit within the available space of computer 10.

Figure 7:
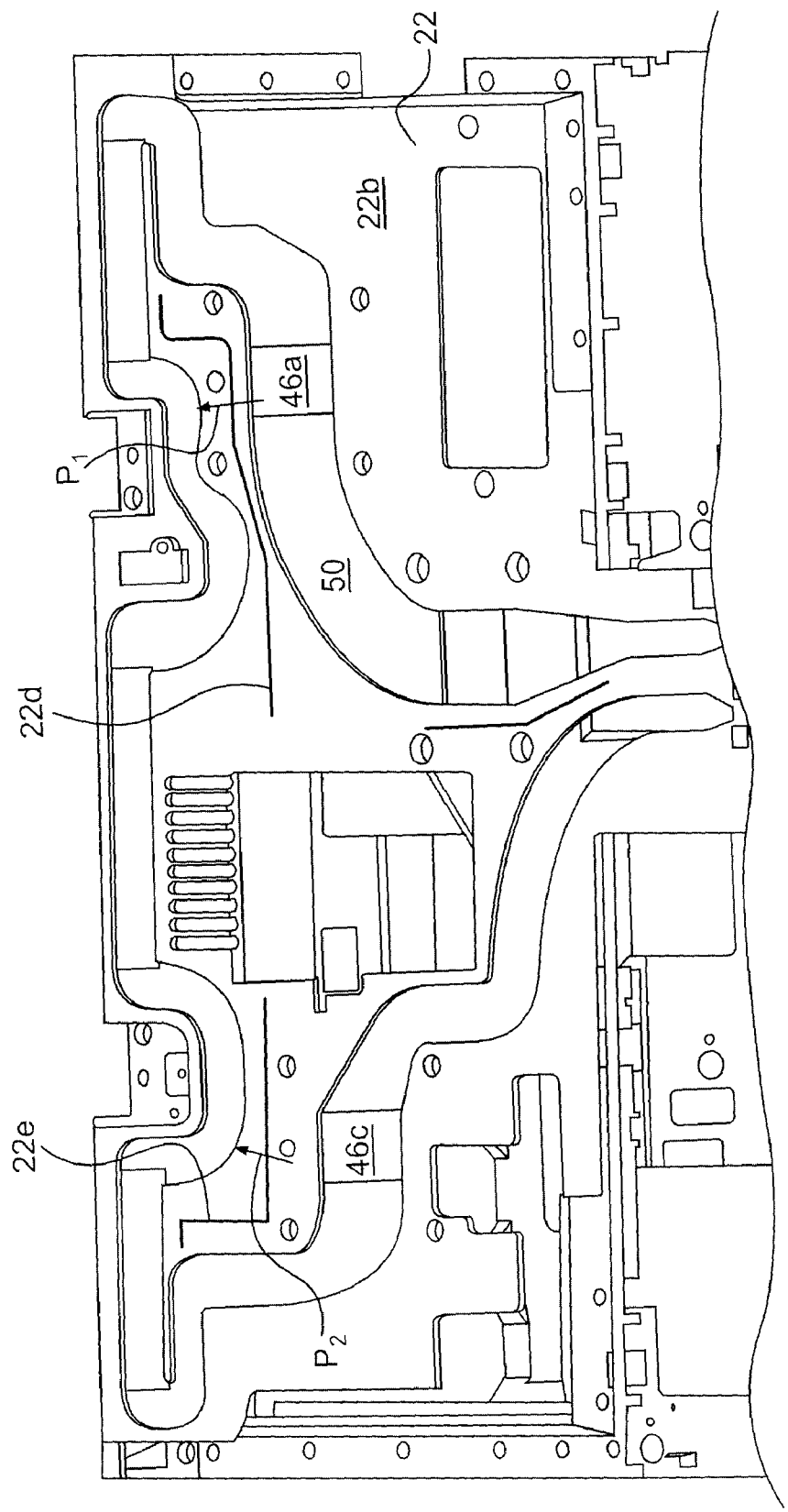
FIG. 7 is an illustration of another exemplary embodiment of the disclosed integrated liquid cooling system.

In addition to the features discussed above, liquid cooling system 20 may include several additional features. For instance, in some embodiments, as illustrated in FIG. 7, monolith 22 may include one or more thermal isolation slits 22d, 22e, etc. to reduce conduction heat transfer along a path. For instance, in FIG. 7, slit 22d may reduce heat conduction along path $P_1$, and slit 22e may reduce heat conduction along path $P_2$. These slits may extend from the second surface 22b of monolith 22 to the first surface 22a, and may serve to disrupt a thermal conduction path in monolith 22. Although these slits may be provided at any location in monolith 22, typically, these slits 22d, 22e may be provided proximate the locations of the cold plates to force more heat to be transferred from the IC devices through the coolant in channel 50. Increasing the amount of heat transfer through the coolant may increase the efficiency of the cooling system 20.

Figure 8C:
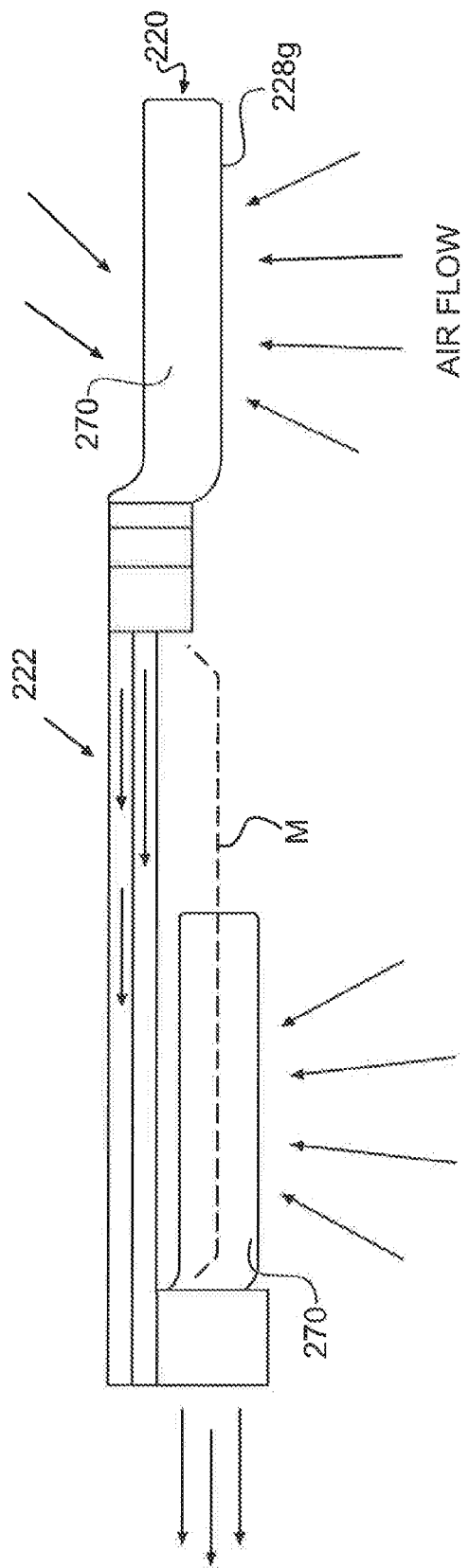

In some embodiments, one or more of the constituent components of the cooling system may be formed together as one part. For instance, in some embodiments, one or of the heat exchangers (such as, first heat exchanger 28a, second heat exchanger 28b, and third heat exchanger 28c) may be combined with monolith 22. FIGS. 8A-8C illustrate an embodiment of cooling system 220, in which these heat exchangers are formed as part of monolith 222. FIG. 8A shows a view of cooling system 220 with the first surface 222a of monolith 222 (and the surfaces of the cold plates that are configured to mate with the IC devices) visible. These cold plates 226a, 226b, and 226c may also be combined with monolith 222 (as described earlier with respect to FIGS. 5B and 5C), or may be formed as a separate component that is later coupled with monolith 222 (as described earlier with reference to FIG. 5A).

FIG. 8B shows an exploded view of cooling system 220, with its components separated, with the second surface 222b of monolith 222 visible. In FIG. 8B, the cap 224 that covers the coolant channel 250 on the second surface 222b of monolith 222 is shown separated to expose coolant channel 250. Although cap 224 is shown to have substantially the same shape as monolith 222 in FIG. 8B, as described earlier with reference to FIG. 4, cap 224 may have other shapes, such as, for example, the shape of channel 250. In this view, the surfaces of the cold plates (226a, 226b, and 226c) that are in contact with the coolant (corresponding with second surface 26e of FIG. 5A) are visible. Although FIG. 8B does not illustrate fins (corresponding with fins 26f of FIG. 5A) on the second surfaces of the cold plates, as described earlier, in some embodiments fins may be provided on this surface.

FIG. 8C illustrates a side view of cooling system 220 identifying an area "M" where a motherboard of a computer may be positioned with respect to cooling system 220. In the description that follows, reference may be made to FIGS. 8A-8C. In this embodiment, the heat exchanger fins 228g that transfer heat to ambient air (corresponding with fins 28g on heat exchanger 28a, described earlier with reference to FIG. 6A) are formed on substantially an entire external surface of cooling system 220. For instance, on substantially an entire area of first surface 222a of monolith 222 (except the regions of the cold plates 226a, 226b, and 226c), and on the external surface of cap 224. The height of the fins 228g on either side of the cooling system 220 may be the same or may be different. In some embodiments, the height of fins 228g on the surface of the cooling system 222 facing the motherboard (first surface of monolith 222 in FIG. 8A) may be such these fins 228g do not interfere with the components on the motherboard. In some embodiments, to minimize interference with components on the motherboard, fins 228g may only be provided on selected regions of the cooling system 220. For instance, in some embodiments, fins 228g may only be provided in areas outside of a keep-out zone that is defined by overlapping surfaces of the motherboard and the cooling system 220. In some other embodiments, fins 228g may only be provided on the surface of cooling system 220 that is opposite the surface that faces the motherboard. One or more fans 270 may be coupled with cooling system 220 to force air through fins 228g as illustrated by arrows in FIG. 8C.

It will be apparent to those skilled in the art that various modifications and variations can be made to the disclosed cooling systems. Other embodiments will be apparent to those skilled in the art from consideration of the specification and practice of the disclosed cooling systems. It is intended that the specification and examples be considered as exemplary only, with a true scope being indicated by the following claims and their equivalents.

What is claimed is:

1. A liquid cooling system for a computer, comprising:
a monolith configured to be coupled to a motherboard of the computer, the monolith being a monolithic planar body having a first surface and a second surface opposite the first surface;
a heat absorption region, the heat absorption region including at least one cold plate attached to the monolith, the cold plate including a first surface configured to be in thermal contact with a heat generating component of the motherboard and a second surface having fins that protrude from the second surface, the second surface being opposite the first surface;
a heat dissipation region, the heat dissipation region including at least one liquid-to-air heat exchanger attached to the monolith, the heat exchanger including a first surface having fins that dissipate heat to air and a second surface having fins that protrude from the second surface, the second surface being opposite the first surface;
a channel extending on the second surface of the monolith, the channel being a trench on the second surface of the monolith that is configured to circulate a liquid coolant between the heat absorption region and the heat dissipation region, wherein the fins on the second surface of the cold plate and the fins on the second surfaCe of the heat exchanger extend into the channel and directly contact the liquid coolant in the channel; and
a pump configured to circulate the liquid coolant through the channel.

2. The liquid coolant system of claim 1, wherein the heat absorption region further includes an additional region of the monolith that is configured to be in thermal contact with a second heat generating component of the motherboard.

3. The liquid coolant system of claim 2, wherein the additional region is a region of the first surface of the monolith that is not directly below the channel.

4. The liquid coolant system of claim 2, wherein the at least one cold plate is attached to the first surface of the monolith and the additional region is a region of the second surface of the monolith.

5. The liquid cooling system of claim 1, wherein the at least one cold plate includes at least two cold plates which are in thermal contact with different heat generating components on the motherboard.

6. The liquid cooling system of claim 1, wherein the at least one cold plate includes at least three cold plates which are in thermal contact with different heat generating components on the motherboard.

7. The liquid cooling system of claim 6, wherein the at least one heat exchanger includes at least three heat exchangers attached to the monolith.

8. The liquid cooling system of claim 1, wherein the monolith includes aluminum and the at least one cold plate includes copper.

9. The liquid cooling system of claim 1, further including a cap attached to the second surface of the monolith to enclose the coolant in the channel.

10. The liquid coolant system of claim 9, wherein the cap has the same general shape as the channel.

11. The liquid coolant system of claim 9, wherein the cap has the same general shape as the second surface of the monolith.

12. A liquid cooling system for a notebook computer, comprising:
a monolith that is configured to be coupled to a motherboard of the notebook computer, the monolith being an aluminum monolithic planar body having a first surface and a second surface that is opposite the first surface;
a channel containing a liquid coolant, the channel being a trench extending along a predefined path on the monolith, the channel being configured to enclose the coolant therein and direct the coolant along the predefined path;
at least two cutouts extending from a base of the channel to the first surface of the monolith;
a cold plate attached at a first cutout of the at least two cutouts, a first surface of the cold plate being configured to be in thermal contact with a heat generating component on the motherboard and a second surface of the cold plate, that is opposite the first surface of the cold plate, including fins that are in direct contact with the coolant in the channel; and
a liquid-to-air heat exchanger attached at a second cutout of the at least two cutouts, a first-surface of the heat exchanger including fins configured to dissipate heat to air and a second surface of the heat exchanger, that is opposite the first surface of the heat exchanger, including, fins that are in direct contact with the coolant in the channel.

13. The liquid cooling system of claim 12, wherein the monolith further includes multiple regions that are in thermal contact with different heat generating electronic components on the motherboard.

14. The liquid cooling system of claim 13, wherein at least one of the multiple regions is a region on these second surface of the monolith.

15. The liquid cooling system of claim 13, wherein at least one of the multiple regions is a region of the first surface of the monolith that is not directly below a cavity.

16. The liquid cooling system of claim 12, further including a cap that is attached to the second surface of the monolith, the cap enclosing the coolant in the cavity.

17. The liquid cooling system of claim 12, wherein the at least two cutouts include at least six cutouts, wherein at least three cutouts include cold plates and at least three cutouts include liquid-to-air heat exchangers.

18. The liquid cooling system of claim 12, wherein the first surface of the heat exchanger includes parallel fins that are exposed to air and the second surface of the heat exchanger includes parallel fins that are exposed to the coolant.

19. The liquid coolant system of claim 18, wherein the fins on the first surface are orthogonal to the fins on the second surface.

20. The liquid cooling system of claim 12, wherein the cold plate includes copper.

21. The liquid cooling system of claim 12, wherein the cold plate and the liquid-to-air heat exchanger are rigidly attached to the monolith such that, when the monolith is not coupled to the motherboard there is substantially no relative motion between components of the cooling system.

22. The liquid cooling system of claim 12, wherein the cooling system is coupled to the motherboard using fastening features on the monolith.

23. An integrated liquid cooling system for a notebook computer that is configured to be coupled to a motherboard of the notebook computer as one single part, comprising:
- a monolith configured to be coupled to the motherboard of the notebook computer, the monolith being a planar body having a first surface and a second surface opposite the first surface, the first surface of the monolith extending over a plurality of heat generating electronic components on the motherboard;
- a plurality of cold plates attached to the monolith, each cold plate of the plurality of cold plates including a first surface configured to be in thermal contact with an electronic component of the plurality of electronic components and a second surface opposite the first surface, the second surface of the cold plate including a plurality of fins extending therefrom;
- a channel including a liquid coolant extending on the second surface of the monolith between the plurality of cold plates and at least one heat dissipation location of the monolith;
- a cap attached to the second surface of the monolith to enclose the coolant in the channel; and
- a liquid-to-air heat exchanger coupled to the at least one heat dissipation location of the monolith, the heat exchanger including a first surface and a second surface opposite the first surface, the first surface including parallel fins configured to dissipate heat to air and the second surface including an array of protruberances configured to absorb heat from the coolant, wherein the plurality of fins on the second surface of each cold plate and the array of protruberances on the second surface of the heat exchanger extend into the channel and are in direct contact with the coolant in the channel.

24. The integrated liquid cooling system of claim 23, wherein the regions of the monolith that are configured to be in thermal contact with heat generating electronic components include at least three cold plates, each cold plate of the at least three cold plates including a first surface that is configured to be in thermal contact with a different heat generating component on the motherboard, and a second surface opposite the first surface that is configured to be in direct contact with the coolant in the channel.

25. The integrated liquid cooling system of claim 23, wherein the at least one heat dissipation location includes at least three heat dissipation locations.

26. The integrated liquid cooling system of claim 25, wherein the protruberances on the second surface of the liquid-to-air heat exchanger are fins that are exposed to coolant in the channel.

* * * * *